United States Patent
Jung et al.

(10) Patent No.: US 11,674,047 B2
(45) Date of Patent: Jun. 13, 2023

(54) COMPOSITION FOR MANUFACTURING PASSIVATION LAYER AND PASSIVATION LAYER USING THE SAME

(71) Applicants: THE CHEMOURS COMPANY FC, LLC, Wilmington, DE (US); NEPES CORPORATION, Chungcheongbuk-do (KR)

(72) Inventors: Eunhwa Jung, Chungcheongbuk-do (KR); Jinkuk Kim, Chungcheongbuk-do (KR); Hyoyeon Kim, Chungcheongbuk-do (KR); Seungsun Jang, Chungcheongbuk-do (KR); Bonggyu Kim, Chungcheongbuk-do (KR); Xudong Chen, Hockessin, DE (US)

(73) Assignees: THE CHEMOURS COMPANY FC, LLC, Wilmington, DE (US); NEPES CORPORATION, Chungcheongbuk-D (KR)

( * ) Notice: Subject to any disclaimer, the term of this patent is extended or adjusted under 35 U.S.C. 154(b) by 488 days.

(21) Appl. No.: 16/774,454

(22) Filed: Jan. 28, 2020

(65) Prior Publication Data
US 2020/0239724 A1 Jul. 30, 2020

Related U.S. Application Data

(60) Provisional application No. 62/797,552, filed on Jan. 28, 2019.

(51) Int. Cl.
| | |
|---|---|
| *C09D 127/12* | (2006.01) |
| *C08F 214/18* | (2006.01) |
| *C08F 230/08* | (2006.01) |
| *C09D 127/18* | (2006.01) |
| *C08F 8/34* | (2006.01) |
| *C08K 5/053* | (2006.01) |
| *C08K 5/13* | (2006.01) |
| *C08K 5/5419* | (2006.01) |
| *H01L 23/29* | (2006.01) |
| *H01L 23/31* | (2006.01) |
| *H01L 21/02* | (2006.01) |

(52) U.S. Cl.
CPC .............. *C09D 127/12* (2013.01); *C08F 8/34* (2013.01); *C08F 214/188* (2013.01); *C08F 230/08* (2013.01); *C09D 127/18* (2013.01); *H01L 21/02282* (2013.01); *H01L 23/293* (2013.01); *H01L 23/3171* (2013.01); *C08F 2810/20* (2013.01); *C08K 5/053* (2013.01); *C08K 5/13* (2013.01); *C08K 5/5419* (2013.01); *C08K 2201/014* (2013.01)

(58) Field of Classification Search
CPC ............................... C08F 8/34; C08F 2810/20
See application file for complete search history.

(56) References Cited

U.S. PATENT DOCUMENTS

| | | | | |
|---|---|---|---|---|
| 4,751,114 A | * | 6/1988 | Homma | .............. C08F 214/188 |
| | | | | 427/407.1 |
| 11,274,226 B2 | * | 3/2022 | Chen | ........................ C09D 7/20 |
| 2006/0275595 A1 | | 12/2006 | Thies et al. | |
| 2016/0369061 A1 | | 12/2016 | Dinkar | |
| 2017/0114242 A1 | | 4/2017 | Lloyd et al. | |

FOREIGN PATENT DOCUMENTS

| | | | | |
|---|---|---|---|---|
| CN | 1791646 A | | 6/2006 | |
| CN | 18200058 A | | 8/2006 | |
| CN | 101611108 A | | 12/2009 | |
| CN | 102844884 A | * | 12/2012 | ....... C09D 123/0892 |
| CN | 105392831 A | | 3/2016 | |
| GB | 1536468 | | 12/1978 | |
| KR | 19960009050 A | | 3/1996 | |
| WO | 03061965 A1 | | 7/2003 | |
| WO | 2008088770 A1 | | 7/2008 | |
| WO | 2011092278 A1 | | 8/2011 | |
| WO | WO-2015187413 A1 | * | 12/2015 | ............... B05D 1/02 |
| WO | 2017136266 A1 | | 8/2017 | |
| WO | 2019018346 A1 | | 1/2019 | |

OTHER PUBLICATIONS

Machine translation of CN 102844884 A, retrieved Jun. 2022 (Year: 2022).*

* cited by examiner

*Primary Examiner* — Nicole M. Buie-Hatcher
(74) *Attorney, Agent, or Firm* — McNees Wallace & Nurick LLC

(57) ABSTRACT

The present invention relates to a composition for manufacturing a passivation layer, and specifically, to a composition for manufacturing a passivation layer and a passivation layer formed using the composition, which simultaneously exhibit effects such as a low dielectric constant, a low water absorption rate, excellent pattern formability, and excellent adhesion to an adherend surface.

18 Claims, No Drawings

COMPOSITION FOR MANUFACTURING PASSIVATION LAYER AND PASSIVATION LAYER USING THE SAME

TECHNICAL FIELD

The present invention relates to a composition for manufacturing a passivation layer and a passivation layer formed from the composition, which simultaneously exhibits commercially desirable effects such as a low dielectric constant, low water absorption rate, excellent pattern formability, and excellent adhesion to an adherend surface.

BACKGROUND ART

In various electronic devices, a predetermined coating layer is applied as an electrical insulating material and to protect the device from damage and moisture due to physical and chemical means.

For this reason, certain coating layers are used as passivation layers in microcircuit electronic devices. When polymers used in the formation of such a passivation layer are photo-crosslinkable to form a polymer pattern with a defined small dimension, in order to provide a three-dimensional framework for the interconnection of multiple electronic components, circuits and layers, usability is greatly increased. As electronic device features trend smaller, shift to higher frequencies, and have lower power consumption, polymers such as polyimides conventionally used in the past are unable to meet new and stringent requirements for a lower dielectric constant, a lower loss tangent and a lower water absorption rate.

Patent applications KR 10-2018-0044790 A and WO2017-136266 A1 disclose passivation layers, but the passivation layers disclosed therein have poor adhesion to an adherend surface in spite of having a low dielectric constant and a low water absorption rate.

Accordingly, there is an urgent need to develop compositions for manufacturing passivation layers which can simultaneously exhibit effects such as a low dielectric constant, low water absorption rate, excellent pattern formability, and excellent adhesion to an adherend surface.

CITATION LIST

Patent Literature (Patent Literature 1) KR 10-1996-0009050 A (Mar. 22, 1996)

DISCLOSURE

Technical Problem

The present invention has been made to solve the above-described problems, and it is an objective of the present invention to provide to a composition for manufacturing a passivation layer and a passivation layer formed using the composition, which simultaneously exhibit effects such as a low dielectric constant, a low water absorption rate, excellent pattern formability, and excellent adhesion to an adherend surface.

Technical Solution

In order to achieve the objective, the present invention provides a composition for manufacturing a passivation layer, including: a fluorocopolymer which is a random copolymer of monomers comprising a fluoroolefin-based compound, a vinyl ether-based compound and a crosslinkable compound selected from the group consisting of silane-based compounds having at least one alkenyl group, and epoxide-based compounds having at least one alkenyl group; and an adhesion promoter.

According to an embodiment of the present invention, the fluoroolefin-based compound comprises a compound represented by the following Formula 1, the vinyl ether-based compound comprises a compound represented by the following Formula 2, and the crosslinkable compound comprises a silane-based compound having at least one alkenyl group represented by the following Formula 3:

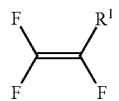

Formula 1

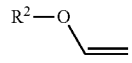

Formula 2

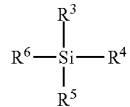

Formula 3 wherein in Formula 1, $R^1$ is a straight-chain perfluoroalkoxy group having 1 to 5 carbon atoms, a branched perfluoroalkoxy group having 3 to 5 carbon atoms, a straight-chain perfluoroalkyl group having 1 to 3 carbon atoms, H, F or Cl, wherein in Formula 2, $R^2$ is a straight-chain alkyl group having 1 to 6 carbon atoms, a branched alkyl group having 3 to 6 carbon atoms, a cyclic alkyl group having 3 to 6 carbon atoms, or a substituted or unsubstituted aryl group, and wherein in Formula 3, $R^3$ is an ethylenically unsaturated hydrocarbon radical, $R^4$ is aryl, aryl substituted hydrocarbon radical, branched alkoxy radical, substituted or unsubstituted cyclic alkoxy radical, branched alkyl radical, or substituted or unsubstituted 5 or 6 carbon cyclic alkyl radical, and $R^5$ and $R^6$ are independently selected from linear or branched alkoxy radical, or substituted or unsubstituted cyclic alkoxy radical. In another embodiment, $R^3$ is an ethylenically unsaturated hydrocarbon radical having 2 to 5 carbon atoms, $R^4$ is aryl, aryl substituted hydrocarbon radical, branched alkoxy radical having 3 to 6 carbon atoms, substituted or unsubstituted 5 or 6 carbon cyclic alkoxy radical, branched alkyl radical having 3 to 6 carbon atoms, or substituted or unsubstituted 5 or 6 carbon cyclic alkyl radical, and $R^4$ and $R^5$ are independently selected from linear or branched alkoxy radical having 1 to 6 carbon atoms, or substituted or unsubstituted 5 or 6 carbon cyclic alkoxy radical.

In another embodiment of the present invention, the fluoroolefin-based compound comprises a compound represented by the following Formula 1, the vinyl ether-based compound comprises a compound represented by the following Formula 2, and the crosslinkable compound comprises an epoxide-based compound having at least one alkenyl group represented by the following Formula 4:

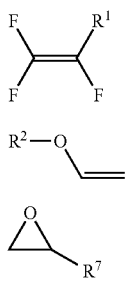

wherein in Formula 1, $R^1$ is a straight-chain perfluoroalkoxy group having 1 to 5 carbon atoms, a branched perfluoroalkoxy group having 3 to 5 carbon atoms, a straight-chain perfluoroalkyl group having 1 to 3 carbon atoms, H, F or Cl, wherein in Formula 2, $R^2$ is a straight-chain alkyl group having 1 to 6 carbon atoms, a branched alkyl group having 3 to 6 carbon atoms, a cyclic alkyl group having 3 to 6 carbon atoms, or a substituted or unsubstituted aryl group, and wherein in Formula 4, $R^7$ is an alkenyl group having 2 to 5 carbon atoms, or an acrylate group represented by the formula $-R^8-O-C(=O)-CR^9=CH_2$, wherein $R^8$ is an alkylene radical having 1 to 5 carbon atoms and $R^9$ is hydrogen or methyl.

In one embodiment, the present adhesion promoter comprises a thiol-based compound. In one embodiment, the thiol-based adhesion promoter is selected from the group consisting of sulfur functionalized carboxylic acids, sulfur functionalized alcohols, and sulfur functionalized silanes. Example thiol-based adhesion promoters include 3-(triethoxysilyl) propanethiol (MPTES), 6-mercapto-1-hexanol, 3-mercaptopropionic acid, 11-mercapto-1-undecanol and 3-(trimethoxysilyl) propanethiol (MPTMS).

In one embodiment, the present adhesion promoter comprises a diol-based compound. In one embodiment, the diol-based adhesion promoter is selected from the group consisting of 1,n-hydrocarbon diols wherein n is from 2 to 6, and alkyl substituted 1,2-benzenediols. Example diol-based adhesion promoters include 4-tert-butylbenzene-1,2-diol, hexane-1,6-diol and 1,3-butylene glycol.

In one embodiment, the adhesion promoter comprises a first adhesion promoter comprising the aforementioned thiol-based adhesion promoter and a second adhesion promoter comprising the aforementioned diol-based adhesion promoter.

In one embodiment, the weight ratio of the first adhesion promoter to the second adhesion promoter is from 1:0.5 to 3.5.

In one embodiment, the composition comprises 0.5 to 3.5 parts by weight of the adhesion promoter based on 100 parts by weight of the fluorocopolymer.

In one embodiment, the composition may further include 0.1 to 5 parts by weight of a photo acid generator (PAG) based on 100 parts by weight of the fluorocopolymer.

In one embodiment, the composition may further include 150 to 450 parts by weight of a solvent based on 100 parts by weight of the fluorocopolymer.

In one embodiment, the composition may further include 0.05 to 5 parts by weight of a photosensitizer (PS) based on 100 parts by weight of the fluorocopolymer.

Moreover, the present invention provides a passivation layer comprising a layer of crosslinked coating composition disposed on the outer surface of a semiconductor device, wherein the coating composition comprises any of the aforementioned embodiments of composition for manufacturing a passivation layer, the composition including: a fluorocopolymer which is a random copolymer copolymerized by including as monomers a fluoroolefin-based compound, a vinyl ether-based compound and a crosslinkable compound selected from the group consisting of silane-based compounds having at least one alkenyl group, and epoxide-based compounds having at least one alkenyl group; and an adhesion promoter.

According to one embodiment of the present invention, at least a portion of the passivation layer may be developed to form a predetermined pattern.

In some embodiments, the outer surface of the semiconductor device on which the present passivation layer is coated comprises at least one substrate selected from the group consisting of electrically conductive material, semiconductive material and nonconductive material. In some embodiments, the outer surface of the semiconductor device comprises at least one substrate selected from the group consisting of glass, polymers, inorganic semiconductors, organic semiconductors, tin oxide, zinc oxide, titanium dioxide, silicon dioxide, indium oxide, indium zinc oxide, zinc tin oxide, indium gallium oxide, indium gallium zinc oxide, indium tin zinc oxide, cadmium sulfide, cadmium selenide, silicon nitride, gold, copper and aluminum.

In some embodiments of the present passivation layer comprising a layer of crosslinked coating composition disposed on the outer surface of a semiconductor device, the area separated in evaluation of adhesion measured by the following Measurement method 1 may be less than 6% of a lattice area, the dielectric constant measured at a frequency of 1 MHz according to ASTM D150 may be 2.65 or less, and the water absorption rate measured by the following Equation 1 may be 0.15% or less:

Measurement Method 1

A passivation layer of an Au substrate on which the passivation layer is formed is cross-cut so that the number of scales is 100 at intervals of 1 mm, and adhesion is evaluated according to ASTM D3359.

Water absorption rate (%)=(($W_2-W_1$)/$W_1$)×100(%)　　　Equation 1 where $W_1$ is a weight of the passivation layer before being left for 24 hours under conditions of a temperature of 85° C. and a relative humidity of 85%, and $W_2$ is a weight of the passivation layer after being left for 24 hours under conditions of a temperature of 85° C. and a relative humidity of 85%.

Advantageous Effects

The passivation layer formed using the composition according to the present invention can simultaneously exhibit effects such as a low dielectric constant, low water absorption rate, excellent pattern formability, and excellent adhesion to an adherend surface, and thus can be widely applied to various articles such as thin film transistors, organic field effect transistors, semiconductors, semiconductor oxide field effect transistors, integrated circuits, light emitting diodes, bank layers including organic light emitting diodes, display devices, printed circuit boards, photovoltaic devices, and the like.

MODE OF THE INVENTION

Hereinafter, embodiments will be described in detail so that those skilled in the art can easily carry out the embodiments. However, the embodiments are not limited to those described below and may have various modifications.

A composition for manufacturing a passivation layer according to an embodiment of the present invention includes: a fluorocopolymer which is a random copolymer of monomers comprising a fluoroolefin-based compound, a vinyl ether-based compound and a crosslinkable compound selected from the group consisting of silane-based compounds having at least one alkenyl group, and epoxide-based compounds having at least one alkenyl group; and an adhesion promoter.

First, the fluorocopolymer will be described.

The fluorocopolymer is a random copolymer of monomers comprising a fluoroolefin-based compound, a vinyl ether-based compound and a crosslinkable compound selected from the group consisting of silane-based compounds having at least one alkenyl group, and epoxide-based compounds having at least one alkenyl group.

The fluoroolefin-based compound may include a compound represented by the following Formula 1.

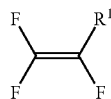

Formula 1

In Formula 1, $R^1$ may be a straight-chain perfluoroalkoxy group having 1 to 5 carbon atoms, a branched perfluoroalkoxy group having 3 to 5 carbon atoms, a straight-chain perfluoroalkyl group having 1 to 3 carbon atoms, H, F or Cl. Preferably, in Formula 1, $R^1$ may be a straight-chain perfluoroalkoxy group having 1 to 3 carbon atoms, a branched perfluoroalkoxy group having three carbon atoms, a perfluoroalkyl group having one carbon atom, F or Cl.

Here, the fluoroolefin-based compound may be included at 39 to 60 mol %, preferably, at 41 to 58 mol %, and more preferably, at 44 to 55 mol % with respect to the total amount of repeat units of the monomers forming the fluorocopolymer.

Further, the vinyl ether-based compound may include a compound represented by the following Formula 2.

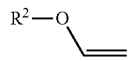

Formula 2]

In Formula 2, $R^2$ may be a straight-chain alkyl group having 1 to 6 carbon atoms, a branched alkyl group having 3 to 6 carbon atoms, a cyclic alkyl group having 3 to 6 carbon atoms, or a substituted or unsubstituted aryl group.

Moreover, the substituted aryl group may be an aryl group in which at least one hydrogen atom on the aromatic ring is substituted, and may be an alkylphenyl, halophenyl or aminophenyl group which is one or more selected from the group consisting of tolyl, xylyl and —$C_6H_4(CH_2CH_3)$.

Here, the vinyl ether-based compound may be included at 39 to 60 mol %, preferably, at 41 to 58 mol %, and more preferably, at 44 to 55 mol % with respect to the total amount of repeat units of the monomers forming the fluorocopolymer.

Furthermore, in one embodiment of the crosslinkable compound, the crosslinkable compound is a silane-based compound having at least one alkenyl group represented by the following Formula 3.

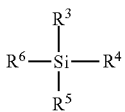

Formula 3

In one embodiment of the present silane-based compound having at least one alkenyl group, in Formula 3: $R^3$ is an ethylenically unsaturated hydrocarbon radical, $R^4$ is aryl, aryl substituted hydrocarbon radical, branched alkoxy radical, substituted or unsubstituted cyclic alkoxy radical, branched alkyl radical, or substituted or unsubstituted 5 or 6 carbon cyclic alkyl radical, and $R^5$ and $R^6$ are independently selected from linear or branched alkoxy radical, or substituted or unsubstituted cyclic alkoxy radical.

In a preferred embodiment of the present silane-based compound having at least one alkenyl group, in Formula 3: $R^3$ is an ethylenically unsaturated hydrocarbon radical having 2 to 5 carbon atoms, $R^4$ is aryl, aryl substituted hydrocarbon radical, branched alkoxy radical having 3 to 6 carbon atoms, substituted or unsubstituted 5 or 6 carbon cyclic alkoxy radical, branched alkyl radical having 3 to 6 carbon atoms, or substituted or unsubstituted 5 or 6 carbon cyclic alkyl radical, and $R^4$ and $R^5$ are independently selected from linear or branched alkoxy radical having 1 to 6 carbon atoms, or substituted or unsubstituted 5 or 6 carbon cyclic alkoxy radical.

In this preferred embodiment of the present silane-based compound having at least one alkenyl group, in Formula 3, $R^4$ is selected to be a relatively sterically bulky substituent bonded to a silicon atom of the silane-based compound. Therefore, it is possible to form compositions of the fluorocopolymer, such as solutions, having a phase stable shelf-life without undesirably forming gel due to silicon-oxygen crosslinking (—Si—O—Si—) by hydrolysis or the like at room temperature, without any special precautions for 3 months or more. For example, the aryl group of $R^4$ may include a phenyl group, a naphthyl group or the like, and the aryl substituted hydrocarbon radical is for example an alkyl group having 1 to 3 carbon atoms and substituted with an aryl group, for example an alkyl group in which at least one hydrogen atom is substituted with an aryl group such as —$CH_2CH_2$-phenyl or the like. Further, $R^4$ may be a branched alkoxy radical having 3 to 6 carbon atoms, for example, isopropoxy, isobutoxy, sec-butoxy, tert-butoxy, and the like. Further $R^4$ may be substituted or unsubstituted 5 or 6 carbon cyclic alkoxy radical, such as —O-cyclopentyl and —O-cyclohexyl, branched alkyl radical having 3 to 6 carbon atoms, such as isopropyl, isobutyl, sec-butyl, tert-butyl, isopentyl, neopentyl, or substituted or unsubstituted 5 or 6 carbon cyclic alkyl radical, such as cyclopentyl, methylcyclopentyl, cyclohexyl, and methylcyclohexyl.

Further, preferably $R^5$ and $R^6$ may be identical, and more preferably, the silane-based compound may be a trialkoxysilane-based compound in which $R^4$, $R^5$, and $R^6$ are identical. For example, the silane-based compound used as one of the monomers in copolymerization to obtain the fluorocopolymer of the present invention may be one or more selected from the group consisting of a vinyl triisopropoxy silane, an allyl triisopropoxy silane, a butenyl triisopropoxy silane and a vinylphenyldimethoxysilane.

Furthermore, in one embodiment of the crosslinkable compound, the crosslinkable compound is a is an epoxide-based compound having at least one alkenyl group represented by the following Formula 4:

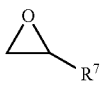

Formula 4 wherein, $R^7$ is an alkenyl group having 2 to 5 carbon atoms, such as ethenyl and allyl, or an acrylate group represented by the formula $-R^8-O-C(=O)-CR^9=CH_2$, wherein $R^8$ is an alkylene radical having 1 to 5 carbon atoms and $R^9$ is hydrogen or methyl, such as $-CH_2-O-C(=O)-C(CH_3)=CH_2$. Example epoxide-based compounds having at least one alkenyl group include allyl glycidyl ether, glycidyl acrylate and glycidyl methacrylate.

Repeat units in the fluorocopolymer arising from the crosslinkable silane-based or epoxide-based compounds having at least one alkenyl group may be included at 0.2 to 10 mol %, preferably, at 1.2 to 8 mol %, and more preferably, at 1.4 to 7 mol % with respect to the total amount of the repeat units of all monomers forming the fluorocopolymer.

When the fluoroolefin-based compound includes the compound represented by Formula 1, the vinyl ether-based compound includes the compound represented by Formula 2, and the crosslinkable compound includes the compound represented by Formula 3 or Formula 4, the effect that adhesion to an adherend surface is excellent can be exhibited due to high compatibility with the adhesion promoter to be described below.

In one embodiment the fluorocopolymer has a weight average molecular weight of 10,000 to 350,000 daltons, preferably, a weight average molecular weight of 50,000 to 350,000 daltons, more preferably, a weight average molecular weight of 100,000 to 350,000 daltons, and furthermore preferably, a weight average molecular weight of 120,000 to 330,000 daltons.

Fluorocopolymers of the present invention may be prepared according to known methods. In some embodiments, monomers may be polymerized without the use of a solvent, and in some embodiments, monomers may be polymerized in a solvent, which may or may not be a solvent for the fluorocopolymer. In other embodiments, the fluorocopolymer may be prepared by emulsion polymerization of monomers. In order to prepare a desired fluorocopolymer, monomers, one or more free radical initiators and, optionally, an acid acceptor are charged into an autoclave and heated at a pressure ranging from atmospheric pressure to as high as 1,500 atm and a temperature ranging from 25° C. to about 200° C. for 10 minutes to 24 hours. Subsequently, the resulting product is taken out of the autoclave, filtered, rinsed and dried to obtain the fluorocopolymer.

A suitable free radical initiator used in a polymerization method to prepare the fluorocopolymer may be any known azo and/or peroxide initiator(s). For example, di(4-t-butylcyclohexyl) dicarbonate, di-t-butyl peroxide, acetyl peroxide, lauroyl peroxide, benzoyl peroxide, 2,2-azodiisobutyronitrile, 2,2-azobis(2,4-dimethyl-4-methoxyvaleronitrile), dimethyl-2,2-azobis(isobutyrate) or combinations thereof may be used. The amount of the free radical initiator which may be used ranges from 0.05 to 4 parts by weight based on 100 parts by weight of the total monomers in a monomer mixture. In other embodiments, the amount of the free radical initiator to be used ranges from 0.1 to 3.5 parts by weight, and in an additional embodiment, the amount of the free radical initiator to be used ranges from 0.2 to 3.25 parts by weight.

The acid acceptor may also be used in the polymerization method to form the present fluorocopolymer. The acid acceptor may be a metal carbonate or a metal oxide, for example, sodium carbonate, calcium carbonate, potassium carbonate, magnesium carbonate, barium oxide, calcium oxide, magnesium oxide or combinations thereof. The amount of the acid acceptor may range from 0 to 5 parts by weight based on 100 parts by weight of the total monomers in a monomer mixture. In other embodiments, the amount of the acid acceptor may range from 0.1 to 4 parts by weight, and in an additional embodiment, the amount of the acid acceptor may range from 0.2 to 3 parts by weight. The acid acceptor may be present in the fluoroolefin-based compound or may be present to neutralize an acid such as hydrogen fluoride that may be generated during a polymerization process.

Next, the adhesion promoter will be described.

The adhesion promoter serves to significantly improve the adhesion between the passivation layer and an adherend surface, especially in the case where the substrate is Au or silicon nitride, and enhance pattern formability.

In one embodiment, the adhesion promoter is a thiol-based adhesion promoter. In another embodiment, the adhesion promoter is a diol-based adhesion promoter. Example thiol-based adhesion promoters include sulfur functionalized carboxylic acids, sulfur functionalized alcohols, and sulfur functionalized silanes. Specific examples of thiol-based adhesion promoters include 3-(triethoxysilyl) propanethiol (MPTES), 6-mercapto-1-hexanol, 3-mercaptopropionic acid, 11-mercapto-1-undecanol and 3-(trimethoxysilyl) propanethiol (MPTMS). Example diol-based adhesion promoters include 1,n-hydrocarbon diols wherein n corresponds to a 2 to 6 carbon hydrocarbon, and alkyl substituted 1,2-benzenediols. Specific examples of diol-based adhesion promoters include 4-tert-butylbenzene-1,2-diol, hexane-1,6-diol and 1,3-butylene glycol.

In one embodiment the adhesion promoter includes a first adhesion promoter comprising a thiol-based adhesion promoter and a second adhesion promoter comprising a diol-based adhesion promoter. In this embodiment, the effects of adhesion to an adherend surface and pattern formability are remarkably excellent. In one embodiment, the first adhesion promoter comprises one or more selected from the group consisting of 3-(triethoxysilyl) propanethiol (MPTES), 6-mercapto-1-hexanol, 3-mercaptopropionic acid, 11-mercapto-1-undecanol and 3-(trimethoxysilyl) propanethiol (MPTMS), preferably 3-(triethoxysilyl) propanethiol (MPTES), and the second adhesion promoter comprises one or more selected from the group consisting of 4-tert-butylbenzene-1,2-diol, hexane-1,6-diol and 1,3-butylene glycol, preferably 4-tert-butylbenzene-1,2-diol. When the first adhesion promoter and the second adhesion promoter each include a preferable material, it can be very advantageous in terms of adhesion to an adherend surface and pattern formability.

In one embodiment the weight ratio of the first adhesion promoter to the second adhesion promoter is from 1:0.5 to 3.5, preferably 1:1 to 2.5. When the weight ratio of the first adhesion promoter and a second adhesion promoter is less than 1:0.5 or more than 1:3.5, the adhesion between the passivation layer and the adherend surface cannot be improved to a desired level, and pattern formability may be deteriorated.

Further, the adhesion promoter may be included at 0.5 to 3.5 parts by weight, and preferably, at 1 to 2.5 parts by weight based on 100 parts by weight of the fluorocopolymer. When the adhesion promoter is included at less than 0.5 part by weight based on 100 parts by weight of the fluorocopolymer, the adhesion between the passivation layer and the adherend surface cannot be improved to a desired level, and pattern formability may be deteriorated. When the adhesion promoter is included at more than 3.5 parts by weight, peeling of the passivation layer may rather occur, stability of a composition may be lowered, and pattern formability may be deteriorated.

Moreover, the composition for manufacturing a passivation layer according to the present invention may further include a photo acid generator.

The photo acid generator may be used without limitation as long as it is a photo acid generator commonly used in the related field, and preferably, may include one or more selected from the group consisting of (p-isopropylphenyl) (p-methylphenyl)iodonium tetrakis(pentafluorophenyl) borate, tris[4-(4-acetylphenyl)sulfanylphenyl] sulfonium tris(trifluoromethanesulfonyl) methide, bis(1,1-dimethylethylphenyl) iodonium salts or bis(4-decylphenyl) iodonium hexafluoroantimonate oxirane having tris[(trifluoromethane)sulfonyl]methane, 4,4',4"-tris(t-butylphenyl)sulfonium triflate, 4,4'-di-t-butylphenyl iodonium triflate, diphenyl iodonium tetrakis(pentafluorophenyl) sulfonium borate, triarylsulfonium-tetrakis(pentafluorophenyl) borate, triphenylsulfonium tetrakis(pentafluorophenyl) sulfonium borate, 4,4'-di-t-butylphenyl iodonium tetrakis(pentafluorophenyl) borate, tris(t-butylphenyl) sulfonium tetrakis(pentafluorophenyl) borate and 4-methylphenyl-4-(1-methylethyl)phenyl iodonium tetrakis(pentafluorophenyl) borate.

Here, the photo acid generator may be further included at 0.1 to 5 parts by weight, preferably, at 0.1 to 2 parts by weight, more preferably, at 0.1 to 1.5 parts by weight, and furthermore preferably, at 0.2 to 1 part by weight based on 100 parts by weight of the fluorocopolymer.

Further, the composition for manufacturing a passivation layer according to the present invention may further include a photosensitizer.

The photosensitizer may be used without limitation as long as it is a photosensitizer commonly used in the related field, and preferably, may include one or more selected from the group consisting of chrysene, benzpyrene, fluoranthene, pyrene, anthracene, phenanthrene, xanthone, indanthrene, thioxanthen-9-one, 2-isopropylthioxanthone, 4-isopropylthioxanthone, 1-chloro-4-propoxythioxanthone and phenothiazine.

The photosensitizer may be selectively further included in the composition for manufacturing a passivation layer, and thus may be further included at 0 to 10 parts by weight, preferably, at 0.05 to 5 parts by weight, more preferably, at 0.1 to 2 parts by weight, and furthermore preferably, at 0.1 to 1 part by weight based on 100 parts by weight of the fluorocopolymer.

Further, the composition for manufacturing a passivation layer according to the present invention may further include a solvent.

The solvent may be further included at 150 to 450 parts by weight, preferably, at 200 to 450 parts by weight, and more preferably, at 250 to 450 parts by weight based on 100 parts by weight of the fluorocopolymer so that the composition for manufacturing a passivation layer containing the fluorocopolymer described above may form a suitable passivation layer on an adhered surface by a predetermined coating method.

Moreover, the fluoropolymer may be present in a state of being dissolved in the solvent in the composition for manufacturing a passivation layer. Here, "dissolved" means that the fluoropolymer is in solution state in the solvent, and no solid or gel fluoropolymer visible to the naked eye remains suspended in the solvent. The composition for manufacturing a passivation layer is formed by a conventional method using a conventional apparatus. For example, the solvent may be added to a stirred vessel and then the fluoropolymer may be added to reach the desired content. A mixture may be stirred, while optionally heating, until the fluoropolymer is dissolved in the solvent.

According to an embodiment of the present invention, the composition for manufacturing a passivation layer is filtered through a cartridge filter having a micrometer or submicrometer (e.g., 0.4 to 4 µm or 1.5 µm) pore size under a predetermined pressure so that particles having a particle size exceeding 0.4 µm are removed from the composition for manufacturing a passivation layer. That is, some small amount of particles of more than 0.4 micrometer but less than 1 micrometer may pass through the filter. Accordingly, there may be substantially no particles having a particle size exceeding 1 µm in the composition for manufacturing a passivation layer.

Moreover, the solvent which may be included in the composition for manufacturing a passivation layer according to the present invention may be a material allowing the fluorocopolymer to dissolve therein and capable of forming a phase-stable composition at ambient conditions.

According to an embodiment of the present invention, the solvent may have a normal boiling point of 50° C. or more, preferably, 100° C. or more, and preferably, 150° C. or more, but the present invention is not limited thereto.

The solvent may be used without limitation as long as it is a solvent commonly used in the related field, and preferably, may include one or more selected from the group consisting of acetone, acetyl acetone, methyl ethyl ketone, methyl isobutyl ketone, methyl amyl ketone, 2-pentanone, 3-pentanone, 2-heptanone, 3-heptanone, cyclopentanone, cyclohexanone, ethyl acetate, propyl acetate, butyl acetate, isobutyl acetate, pentyl acetate, cyclohexyl acetate, heptyl acetate, ethyl propionate, propyl propionate, butyl propionate, isobutyl propionate, propylene glycol monomethyl ether acetate, propylene glycol monoethyl ether acetate, methyl lactate, ethyl lactate, gamma-butyrolactone, diisopropyl ether, dibutyl ether, ethyl propyl ether, anisole, dichloromethane, chloroform and tetrachlorethylene.

According to another embodiment of the present invention, the solvent may be a non-reactive solvent, which means that the solvent is not a constituent of the passivation layer that is finally manufactured.

Moreover, the present invention provides a passivation layer formed by crosslinking a present composition for manufacturing a passivation layer by light and heat, in which the composition for manufacturing a passivation layer comprises: a fluorocopolymer which is a random copolymer formed by randomly copolymerizing the previously described fluoroolefin-based compound, vinyl ether-based compound and crosslinkable compound; and an adhesion promoter.

Here, at least a part of the passivation layer according to the present invention may be developed to form a predetermined pattern.

Further, in the passivation layer according to the present invention, an area separated in evaluation of adhesion measured by the following Measurement method 1 may be less than 6% of a lattice area, and preferably, may be less than 5% of a lattice area.

Measurement Method 1

A passivation layer of an Au substrate on which the passivation layer is formed is cross-cut so that the number of scales is 100 at intervals of 1 mm, and adhesion is evaluated according to ASTM D3359.

When the area separated in the adhesion evaluation exceeds 6% of the lattice area, it is considered that adhesion is poor.

Further, the passivation layer according to the present invention may have a dielectric constant of 2.65 F/m or less, preferably, 2.6 F/m or less, and more preferably, 2.58 F/m or less measured at a frequency of 1 MHz according to ASTM D150.

Furthermore, the passivation layer according to the present invention may have a water absorption rate of 0.15% or less measured by the following Equation 1, and preferably, a water absorption rate of 0.13% or less.

$$\text{Water absorption rate (\%)} = ((W_2 - W_1)/W_1) \times 100 (\%) \quad \text{Equation 1}$$

Here, $W_1$ is a weight of the passivation layer before being left for 24 hours under conditions of a temperature of 85° C. and a relative humidity of 85%, and $W_2$ is a weight of the passivation layer after being left for 24 hours under conditions of a temperature of 85° C. and a relative humidity of 85%.

Moreover, a method of forming a passivation layer on a substrate will be described below as an example of a method of forming a passivation layer on an adherend surface using the composition for manufacturing a passivation layer according to the present invention. However, the method is merely an example, and the present invention is not limited thereto.

The passivation layer may be formed on a variety of substrates including an electrically conductive material, a semiconductive material and/or a nonconductive material. For example, the substrate may be one or more selected from the group consisting of glass, polymers, inorganic semiconductors, organic semiconductors, tin oxide, zinc oxide, titanium dioxide, silicon dioxide, indium oxide, indium zinc oxide, zinc tin oxide, indium gallium oxide, indium gallium zinc oxide, indium tin zinc oxide, cadmium sulfide, cadmium selenide, silicon nitride, gold, copper and aluminum, and preferably, may be silicon nitride or gold.

The method of forming a passivation layer on a substrate using the composition for manufacturing a passivation layer may include Step (1) of treating at least a portion of the substrate with the composition for manufacturing a passivation layer.

The treatment with the composition may be performed by conventional processes such as by spin coating, spray coating, flow coating, curtain coating, roller coating, brushing, inkjet printing, screen printing, offset printing, gravure printing, flexographic printing, lithographic printing, dip coating, blade coating or drop coating methods. Spin coating involves applying an excess amount of the composition for manufacturing a passivation layer to the substrate, then rotating the substrate at a high speed to uniformly spread and distribute the composition across the surface of the substrate by centrifugal force. The thickness of the resulting passivation layer may depend on the spin coating rate, concentration of the composition for manufacturing a passivation layer, as well as the solvent used.

Further, the method may include Step (2) of removing at least a portion of the solvent from the composition for manufacturing a passivation layer treated on at least a portion of the substrate.

After treating the substrate with the composition for manufacturing a passivation layer, at least a portion of, or preferably substantially all of the solvent may be removed by exposure to a predetermined temperature and a pressure below atmospheric pressure, by directly or indirectly blowing gas onto the treated composition for manufacturing a passivation layer or by using a combination of these methods.

For example, the treated composition for manufacturing a passivation layer may be heated in air or optionally in a vacuum oven with a small purge of nitrogen gas. In other embodiments, the treated composition for manufacturing a passivation layer may be heated to a temperature in the range of from 60 to 110° C. to remove the solvent.

Further, the method includes Step (3) of forming a crosslinked passivation layer. In the crosslinking, the fluoropolymer may be considered to be a crosslinkable fluoropolymer, meaning an uncrosslinked fluoropolymer that is capable of being crosslinked. For example, the fluoropolymer may be a photo/heat-crosslinkable fluorocopolymer in which a portion of the uncrosslinked fluoropolymer may be photocrosslinked when irradiated with a predetermined wavelength of light in the presence of one or more of the photoacid generator and the photosensitizer, and, for example, an epoxide contained in the fluorocopolymer undergoes a ring opening reaction by light irradiation so that a composition is cross-linked.

In one embodiment, the step of forming a passivation layer by crosslinking the fluorocopolymer includes forming a passivation layer by photo and/or thermal crosslinking of the fluorocopolymer. In one embodiment, the crosslinking between the fluorocopolymer substituents arising from the silane-based compound or the epoxide-based compound is formed as a result of photo and thermal action.

Moreover, the composition for manufacturing a passivation layer and the passivation layer formed using the composition according to the present invention can simultaneously exhibit effects such as a low dielectric constant, a low water absorption rate, excellent pattern formability, and excellent adhesion to an adherend surface, and thus can be widely applied to various articles such as thin film transistors, organic field effect transistors, semiconductors, semiconductor oxide field effect transistors, integrated circuits, light emitting diodes, bank layers including organic light emitting diodes, display devices, printed circuit boards, photovoltaic device, and the like.

The present invention will now be described more specifically with reference to the following examples. However, the following examples should not be construed as limiting the scope of the present invention, and should be construed to facilitate understanding of the present invention.

EXAMPLES

Example 1

(1) Preparation of Fluorocopolymer

A 400 ml autoclave cooled to a temperature of −25° C. is loaded with 0.5 g of powdered potassium carbonate (PX1390-1, EMD Millipore), 0.24 g of dimethyl 2,2'-azobisisobutyrate (V-601, FUJIFILM Wako Pure Chemical Corporation), 3.8 mL (4.4 g) of a silane-based compound (SIV9210, Gelest, Inc.) which is a compound represented by the following Formula 3, 36 g (0.5 mol) of a vinyl ether-based compound (A15691-0F, Alfa Aesar) which is a compound represented by the following Formula 2, and 200 mL (250 g) of 1,1,1,3,3-pentafluorobutane (H33737, Alfa Aesar). Thereafter, the autoclave is evacuated and further loaded with 50 g (0.5 mol) of a fluoroolefin-based compound which is a compound represented by the following Formula 1. The resultant reaction mixture is shaken and heated to 66° C. Pressure in the autoclave peaks at 200 psig, dropping to 76 psig 8 hours later. During cooling, a viscous liquid (233.85 g) is obtained. The product is purged with nitrogen for about 3 days and then further dried in a 74° C. vacuum oven for 19 hours to prepare the fluorocopolymer.

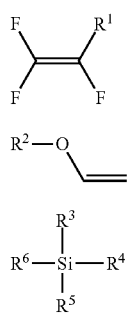

Formula 1

Formula 2

Formula 3

$R^1$ was F in Formula 1, $R^2$ was a straight-chain alkyl group (ethyl group) having two carbon atoms in Formula 2, and $R^3$ was a vinyl group, and $R^4$, $R^5$ and $R^6$ each represented a branched alkoxy group (isopropoxy group) having three carbon atoms.

(2) Preparation of Composition for Manufacturing Passivation Layer 29.75 g of the fluorocopolymer prepared above and 69.41 g of propylene glycol monomethyl ether acetate (PGMEA) as a solvent is mixed and stirred for 6 hours until the fluorocopolymer is dissolved. Thereafter, 0.13 g of 4-isopropyl-4'-methyldiphenyliodonium tetrakis(pentafluorophenyl) borate as a photo acid generator, 0.07 g of 2-isopropylthioxanthone as a photosensitizer, and 0.45 g (1.51 parts by weight based on 100 parts by weight of the fluorocopolymer) of an adhesion promoter which includes 3-(triethoxysilyl) propanethiol (MPTES) as a first adhesion promoter and 4-tert-butylbenzene-1,2-diol as a second adhesion promoter in a weight ratio of 1:1.5 is sequentially mixed and stirred for 2 hours to prepare a composition for manufacturing a passivation layer.

(3) Formation of Passivation Layer

An Au substrate is spin-coated with the composition for manufacturing a passivation layer prepared above at 2000 rpm (revolutions per minute), and then the substrate coated with the composition for manufacturing a passivation layer is heat-treated on a hot plate at a temperature of 90° C. for 3 minutes to form a coating layer having a thickness of 7 μm. Then, the substrate having a coating layer formed thereon is covered with a mask printed with a chrome pattern, and exposed to UV light generated at an output power of 15 mW/cm² by a high pressure mercury lamp (i, g and h line) in a mask aligner for 20 seconds. Subsequently, the exposed substrate is subjected to post-heat treatment at a temperature of 80° C. for 2 minutes, and the post-heat-treated substrate is subjected to puddle development in propylene glycol monomethyl ether acetate which is a developing solution at 23° C. for 4 minutes. Finally, the substrate is baked in an oven purged with nitrogen at 230° C. for 2 hours to prepare a substrate having a passivation layer which has a thickness of 6 μm and square patterns with a width of 25 μm and a length of 25 μm.

Examples 2 to 14 and Comparative Example

The passivation layers shown in Tables 1 to 3 were prepared in the same manner as in Example 1 except that conditions such as the weight ratio and types of the first adhesion promoter and the second adhesion promoter contained in the adhesion promoter included in the composition for manufacturing a passivation layer, whether or not the first adhesion promoter and the second adhesion promoter each are contained, the total content of the adhesion promoter and whether or not the adhesion promoter is included and the like were changed.

Experimental Example 1

The following properties of the substrates on which the passivation layers prepared in Examples and Comparative Examples are formed were evaluated and shown in Tables 1 to 4.

1. Evaluation of Adhesion

For the substrates having the passivation layers prepared in Examples and Comparative Examples, the passivation layer of each specimen is cut into a lattice pattern such that the number of scales is 100 at intervals of 1 mm using a cutter according to an ASTM D3359 method. Next, an adhesive tape is attached thereto, and the state of adhesion of the passivation layer after detaching the adhesive tape is confirmed and qualified as 5B through 0B as follows:

5B: the edges of the cut were perfectly smooth and none of the squares of the lattice were separated.

4B: a small piece of the coating was separated at an intersection so that less than 5% of the area was affected.

3B: a small piece of the coating is separated at an intersection along the edge so that the affected area was 5% or more and less than 15% of the lattice.

2B: coating was thinly torn along the edges and squares so that the affected area was 15% or more and less than 35% of the lattice.

1B: coating peeled off along the edges and squares and the entire square was peeled off so that the affected area was 35% or more and less than 65% of the lattice.

0B: the entire square was peeled off so that the affected area was 65% or more of the lattice.)

2. Evaluation of Pattern Formability

The pattern formability of the patterns formed on the substrates having the passivation layers prepared in Examples and Comparative Examples are evaluated through an optical microscope. Here, a case where all the patterns are formed to have a width of 25 μm and a length of 25 μm is rated as ⊚, a case where the number of patterns formed to have a width of 25 μm and a length of 25 μm was 50 to 80% of the entire patterns due to partial peeling or no development is rated as ○, a case where the number of patterns formed to have a width of 25 μm and a length of 25 μm was 20 to 50% of the entire patterns due to partial peeling or no development is rated as Δ, and a case where no pattern was formed since all of the coating was peeled off is rated as X to evaluate pattern formability.

3. Evaluation of Dielectric Constant

The passivation layers prepared in Examples and Comparative Examples are formed on a conductive substrate such as Au or Ag, and dielectric constants are evaluated at a frequency of 1 MHz using an inter-dielectric bridge method (ASTM D150).

4. Evaluation of Water Absorption Rate

The substrates on which the passivation layers prepared in Examples and Comparative Examples are formed are left for 24 hours at constant temperature and humidity, that is, under conditions of a temperature of 85° C. and a relative humidity of 85%, and then the water absorption rates thereof are evaluated according to the following Equation 1 using a method of measuring the change in weights of before and after the substrates absorb moisture at constant temperature and humidity.

$$\text{Water absorption rate (\%)} = ((W_2 - W_1)/W_1) \times 100(\%) \qquad \text{Equation 1}$$

Here, $W_1$ is a weight of the passivation layer before being left for 24 hours under conditions of a temperature of 85° C. and a relative humidity of 85%, and $W_2$ is a weight of the passivation layer after being left for 24 hours under conditions of a temperature of 85° C. and a relative humidity of 85%.

TABLE 1

| | Classification | Example 1 | Example 2 | Example 3 | Example 4 | Example 5 |
|---|---|---|---|---|---|---|
| Adhesion promoter | First adhesion promoter | 3-(triethoxysilyl) propanethiol | 3-(triethoxysilyl) propanethiol | 3-(triethoxysilyl) propanethiol | 3-(triethoxysilyl) propanethiol | 3-(triethoxysilyl) propanethiol |
| | Second adhesion promoter | 4-tert-butylbenzene-1,2-diol | 4-tert-butylbenzene-1,2-diol | 4-tert-butylbenzene-1,2-diol | 4-tert-butylbenzene-1,2-diol | 4-tert-butylbenzene-1,2-diol |
| | Weight ratio of the first and second adhesion promoters | 1:1.5 | 1:0.3 | 1:1 | 1:2.5 | 1:4.5 |
| | Contents (parts by weight) | 1.51 | 1.51 | 1.51 | 1.51 | 1.51 |
| Evaluation of properties | Adhesion | 5B | 2B | 4B | 4B | 2B |
| | Pattern formability | ◎ | X | ○ | ○ | X |
| | Dielectric constant (k) | 2.54 | 2.61 | 2.57 | 2.55 | 2.58 |
| | Water absorption rate (%) | 0.11 | 0.12 | 0.11 | 0.12 | 0.13 |

TABLE 2

| | Classification | Example 6 | Example 7 | Example 8 | Example 9 | Example 10 |
|---|---|---|---|---|---|---|
| Adhesion promoter | First adhesion promoter | 3-(triethoxysilyl) propanethiol | 3-(triethoxysilyl) propanethiol | 3-(triethoxysilyl) propanethiol | 3-(triethoxysilyl) propanethiol | 3-(triethoxysilyl) propanethiol |
| | Second adhesion promoter | 4-tert-butylbenzene-1,2-diol | 4-tert-butylbenzene-1,2-diol | 4-tert-butylbenzene-1,2-diol | 4-tert-butylbenzene-1,2-diol | — |
| | Weight ratio of the first and second adhesion promoters | 1:1.5 | 1:1.5 | 1:1.5 | 1:1.5 | — |
| | Contents (parts by weight) | 0.3 | 1 | 2.5 | 4.5 | 1.51 |
| Evaluation of properties | Adhesion | 2B | 4B | 4B | 2B | 2B |
| | Pattern formability | X | ○ | ○ | X | X |
| | Dielectric constant (k) | 2.59 | 2.58 | 2.56 | 2.58 | 2.57 |
| | Water absorption rate (%) | 0.13 | 0.12 | 0.11 | 0.12 | 0.14 |

TABLE 3

| | Classification | Example 11 | Example 12 | Example 13 | Example 14 | Comparative Example |
|---|---|---|---|---|---|---|
| Adhesion promoter | First adhesion promoter | — | Vinyltrimethoxysilane | Vinyltrimethoxysilane | 3-(triethoxysilyl) propanethiol | — |
| | Second adhesion promoter | 4-tert-butylbenzene-1,2-diol | — | 4-tert-butylbenzene-1,2-diol | (3-aminopropyl) triethoxysilane | — |
| | Weight ratio of the first and second adhesion promoters | — | — | 1:1.5 | 1:1.5 | — |
| | Contents (parts by weight) | 1.51 | — | 1.51 | 1.51 | — |

| | Classification | Example 11 | Example 12 | Example 13 | Example 14 | Comparative Example |
|---|---|---|---|---|---|---|
| Evaluation of properties | Adhesion | 2B | 1B | 2B | 2B | 0B |
| | Pattern formability | X | X | X | X | X |
| | Dielectric constant (k) | 2.60 | 2.57 | 2.59 | 2.57 | 2.61 |
| | Water absorption rate (%) | 0.13 | 0.13 | 0.12 | 0.13 | 0.13 |

It can be seen from Tables 1 to 3 that, Examples 1, 3, 4, 7 and 8, in which conditions including the weight ratio and types of the first adhesion promoter and the second adhesion promoter contained in the adhesion promoter included in the composition for manufacturing a passivation layer according to the present invention, whether or not the first adhesion promoter and the second adhesion promoter each are contained, the total content of the adhesion promoter and whether or not the adhesion promoter is included and the like are all satisfied, can simultaneously exhibit effects such as remarkably excellent adhesion to an adherend surface and pattern formability, and a low dielectric constant and a low water absorption rate as compared with Examples 2, 5, 6, 9 to 14 and Comparative Example in which any one of the above-described conditions is unsatisfied.

Although certain embodiments of the present invention have been described, it shall be appreciated that the technical ideas of the present invention is not limited to the described embodiments and that other embodiments are possible within the same or equivalent technical ideas by those skilled in the art to which the present invention pertains by adding, modifying, deleting and supplementing the elements.

The invention claimed is:

1. A composition for manufacturing a passivation layer, comprising:
   a fluorocopolymer which is a random copolymer of monomers comprising a fluoroolefin-based compound, a vinyl ether-based compound, and a crosslinkable compound selected from the group consisting of silane-based compounds having at least one alkenyl group and epoxide-based compounds having at least one alkenyl group; and
   a diol-based adhesion promoter.

2. The composition according to claim 1, wherein the fluoroolefin-based compound is a compound represented by the following formula 1, the vinyl ether-based compound is a compound represented by the following formula 2, and the crosslinkable compound is a silane-based compound having at least one alkenyl group represented by the following formula 3:

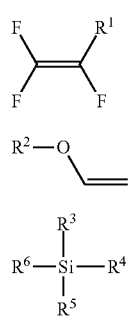

wherein in formula 1, $R^1$ is a straight-chain perfluoroalkoxy group having 1 to 5 carbon atoms, a branched perfluoroalkoxy group having 3 to 5 carbon atoms, a straight-chain perfluoroalkyl group having 1 to 3 carbon atoms, H, F, or Cl, wherein in formula 2, $R^2$ is a straight-chain alkyl group having 1 to 6 carbon atoms, a branched alkyl group having 3 to 6 carbon atoms, a cyclic alkyl group having 3 to 6 carbon atoms, or a substituted or unsubstituted aryl group, and wherein in formula 3, $R^3$ is an ethylenically unsaturated hydrocarbon radical, $R^4$ is aryl, aryl substituted hydrocarbon radical, branched alkoxy radical, substituted or unsubstituted cyclic alkoxy radical, branched alkyl radical, or substituted or unsubstituted 5 or 6 carbon cyclic alkyl radical, and $R^5$ and $R^6$ are independently selected from linear or branched alkoxy radical, or substituted or unsubstituted cyclic alkoxy radical.

3. The composition according to claim 1, wherein the fluoroolefin-based compound is a compound represented by the following formula 1, the vinyl ether-based compound is a compound represented by the following formula 2, and the crosslinkable compound is a silane-based compound having at least one alkenyl group represented by the following formula 3:

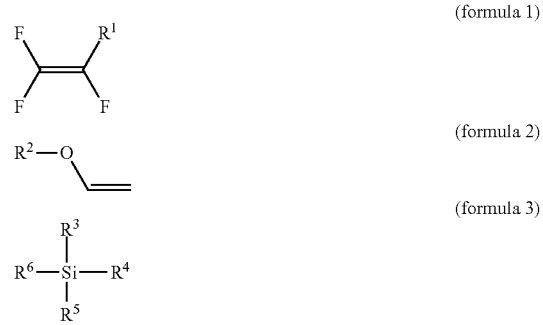

wherein in formula 1, $R^1$ is a straight-chain perfluoroalkoxy group having 1 to 5 carbon atoms, a branched perfluoroalkoxy group having 3 to 5 carbon atoms, a straight-chain perfluoroalkyl group having 1 to 3 carbon atoms, H, F, or Cl, wherein in formula 2, $R^2$ is a straight-chain alkyl group having 1 to 6 carbon atoms, a branched alkyl group having 3 to 6 carbon atoms, a cyclic alkyl group having 3 to 6 carbon atoms, or a substituted or unsubstituted aryl group, and wherein in formula 3, $R^3$ is an ethylenically unsaturated hydrocarbon radical having 2 to 5 carbon atoms, $R^4$ is aryl, aryl substituted hydrocarbon radical, branched alkoxy radical having 3 to 6 carbon atoms, substituted or unsubstituted 5 or 6 carbon cyclic alkoxy radical, branched alkyl radical having 3 to 6 carbon atoms, or substituted or unsubstituted 5 or 6 carbon cyclic alkyl radical, and R⁴ and R⁵ are independently selected from linear or branched alkoxy radical having 1 to 6 carbon atoms, or substituted or unsubstituted 5 or 6 carbon cyclic alkoxy radical.

4. The composition according to claim 1, wherein the fluoroolefin-based compound is a compound represented by the following formula 1, the vinyl ether-based compound is a compound represented by the following formula 2, and the crosslinkable compound is an epoxide-based compound having at least one alkenyl group represented by the following formula 4:

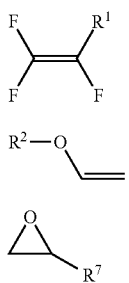

(formula 1)

(formula 2)

(formula 3)

wherein in formula 1, R¹ is a straight-chain perfluoroalkoxy group having 1 to 5 carbon atoms, a branched perfluoroalkoxy group having 3 to 5 carbon atoms, a straight-chain perfluoroalkyl group having 1 to 3 carbon atoms, H, F, or Cl, wherein in formula 2, R² is a straight-chain alkyl group having 1 to 6 carbon atoms, a branched alkyl group having 3 to 6 carbon atoms, a cyclic alkyl group having 3 to 6 carbon atoms, or a substituted or unsubstituted aryl group, and wherein in formula 4, R⁷ is an alkenyl group having 2 to 5 carbon atoms, or an acrylate group represented by the formula —R⁸—O—C(=O)—CR⁹=CH₂, wherein R⁸ is an alkylene radical having 1 to 5 carbon atoms and R⁹ is hydrogen or methyl.

5. The composition according to claim 1, wherein said diol-based adhesion promoter is selected from the group consisting of 1,n-hydrocarbon diols, wherein n is from 2 to 6, and alkyl substituted 1,2-benzenediols.

6. The composition according to claim 1, wherein said diol-based adhesion promoter is selected from the group consisting of 4-tert-butylbenzene-1,2-diol, hexane-1,6-diol, and 1,3-butylene glycol.

7. The composition according to claim 1 further comprising a thiol-based adhesion promoter.

8. The composition according to claim 7, wherein the thiol-based adhesion promoter is one or more selected from the group consisting of sulfur functionalized carboxylic acids, sulfur functionalized alcohols, and sulfur functionalized silanes, and the diol-based adhesion promoter is one or more selected from the group consisting of 1,n-hydrocarbon diols, wherein n is from 2 to 6, and alkyl substituted 1,2-benzenediols.

9. The composition according to claim 7, wherein the thiol-based adhesion promoter is one or more selected from the group consisting of 3-(triethoxysilyl) propanethiol (MPTES), 6-mercapto-1-hexanol, 3-mercaptopropionic acid, 11-mercapto-1-undecanol, and 3-(trimethoxysilyl) propanethiol (MPTMS), and the diol-based adhesion promoter is one or more selected from the group consisting of 4-tert-butylbenzene-1,2-diol, hexane-1,6-diol, and 1,3-butylene glycol.

10. The composition according to claim 7, wherein the weight ratio of the thiol-based adhesion promoter to the diol-based adhesion promoter is from 1:0.5 to 3.5.

11. The composition according to claim 1, comprising 0.5 to 3.5 parts by weight of the diol-based adhesion promoter based on 100 parts by weight of the fluorocopolymer.

12. The composition according to claim 1, further comprising 0.1 to 5 parts by weight of a photo acid generator (PAG) based on 100 parts by weight of the fluorocopolymer.

13. The composition according to claim 1, further comprising 150 to 450 parts by weight of a solvent based on 100 parts by weight of the fluorocopolymer.

14. The composition according to claim 1, further comprising 0.05 to 5 parts by weight of a photosensitizer (PS) based on 100 parts by weight of the fluorocopolymer.

15. A composition for manufacturing a passivation layer, comprising:
   a fluorocopolymer which is a random copolymer of monomers comprising a fluoroolefin-based compound, a vinyl ether-based compound, and a crosslinkable compound selected from the group consisting of silane-based compounds having at least one alkenyl group and epoxide-based compounds having at least one alkenyl group; and
   a thiol-based adhesion promoter selected from the group consisting of 3-(triethoxysilyl) propanethiol (MPTES), 6-mercapto-1-hexanol, 3-mercaptopropionic acid, 11-mercapto-1-undecanol, and 3-(trimethoxysilyl) propanethiol (MPTMS).

16. The composition according to claim 15, wherein the fluoroolefin-based compound is a compound represented by the following formula 1, the vinyl ether-based compound is a compound represented by the following formula 2, and the crosslinkable compound is a silane-based compound having at least one alkenyl group represented by the following formula 3:

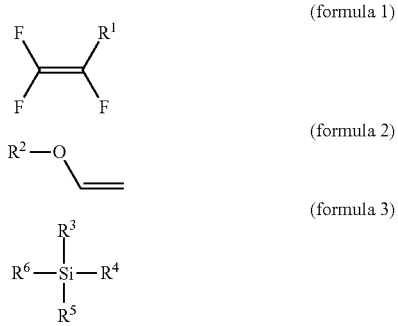

(formula 1)

(formula 2)

(formula 3)

wherein in formula 1, R¹ is a straight-chain perfluoroalkoxy group having 1 to 5 carbon atoms, a branched perfluoroalkoxy group having 3 to 5 carbon atoms, a straight-chain perfluoroalkyl group having 1 to 3 carbon atoms, H, F, or Cl, wherein in formula 2, R² is a straight-chain alkyl group having 1 to 6 carbon atoms, a branched alkyl group having 3 to 6 carbon atoms, a cyclic alkyl group having 3 to 6 carbon atoms, or a substituted or unsubstituted aryl group, and wherein in formula 3, R³ is an ethylenically unsaturated hydrocarbon radical, R⁴ is aryl, aryl substituted hydrocarbon radical, branched alkoxy radical, substituted or unsubstituted cyclic alkoxy radical, branched alkyl radical, or substituted or unsubstituted 5 or 6 carbon cyclic alkyl radical, and $R^5$ and $R^6$ are independently selected from linear or branched alkoxy radical, or substituted or unsubstituted cyclic alkoxy radical.

17. The composition according to claim 15, wherein the fluoroolefin-based compound is a compound represented by the following formula 1, the vinyl ether-based compound is a compound represented by the following formula 2, and the crosslinkable compound is a silane-based compound having at least one alkenyl group represented by the following formula 3:

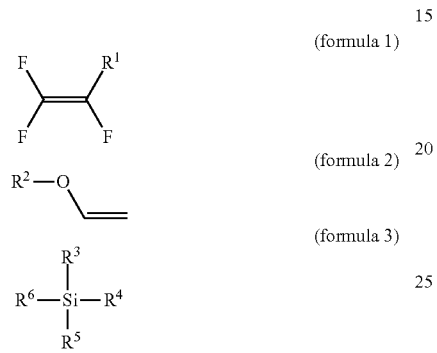

(formula 1)

(formula 2)

(formula 3)

wherein in formula 1, $R^1$ is a straight-chain perfluoroalkoxy group having 1 to 5 carbon atoms, a branched perfluoroalkoxy group having 3 to 5 carbon atoms, a straight-chain perfluoroalkyl group having 1 to 3 carbon atoms, H, F, or Cl, wherein in formula 2, $R^2$ is a straight-chain alkyl group having 1 to 6 carbon atoms, a branched alkyl group having 3 to 6 carbon atoms, a cyclic alkyl group having 3 to 6 carbon atoms, or a substituted or unsubstituted aryl group, and wherein in formula 3, $R^3$ is an ethylenically unsaturated hydrocarbon radical having 2 to 5 carbon atoms, $R^4$ is aryl, aryl substituted hydrocarbon radical, branched alkoxy radical having 3 to 6 carbon atoms, substituted or unsubstituted 5 or 6 carbon cyclic alkoxy radical, branched alkyl radical having 3 to 6 carbon atoms, or substituted or unsubstituted 5 or 6 carbon cyclic alkyl radical, and $R^4$ and $R^5$ are independently selected from linear or branched alkoxy radical having 1 to 6 carbon atoms, or substituted or unsubstituted 5 or 6 carbon cyclic alkoxy radical.

18. The composition according to claim 15, wherein the fluoroolefin-based compound is a compound represented by the following formula 1, the vinyl ether-based compound is a compound represented by the following formula 2, and the crosslinkable compound is an epoxide-based compound having at least one alkenyl group represented by the following formula 4:

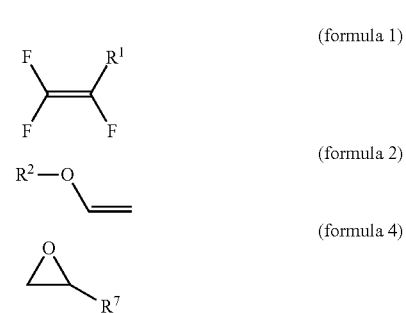

(formula 1)

(formula 2)

(formula 4)

wherein in formula 1, $R^1$ is a straight-chain perfluoroalkoxy group having 1 to 5 carbon atoms, a branched perfluoroalkoxy group having 3 to 5 carbon atoms, a straight-chain perfluoroalkyl group having 1 to 3 carbon atoms, H, F, or Cl, wherein in formula 2, $R^2$ is a straight-chain alkyl group having 1 to 6 carbon atoms, a branched alkyl group having 3 to 6 carbon atoms, a cyclic alkyl group having 3 to 6 carbon atoms, or a substituted or unsubstituted aryl group, and wherein in formula 4, $R^7$ is an alkenyl group having 2 to 5 carbon atoms, or an acrylate group represented by the formula —$R^8$—O—C(=O)—$CR^9$=$CH_2$, wherein $R^8$ is an alkylene radical having 1 to 5 carbon atoms and $R^9$ is hydrogen or methyl.

* * * * *